United States Patent [19]

Inoue et al.

[11] Patent Number: 4,824,010
[45] Date of Patent: Apr. 25, 1989

[54] PROCESS AND APPARATUS FOR SOLDERING PRINTED CIRCUIT BOARDS

[75] Inventors: Takao Inoue, Hirakata; Keiji Saeki, Kadoma; Chuichi Matsuda, Neyagawa; Schuichi Murakami, Hirakata, all of Japan

[73] Assignee: Matsushita Electric Industrial Co., Ltd., Osaka, Japan

[21] Appl. No.: 920,142

[22] Filed: Oct. 17, 1986

Related U.S. Application Data

[63] Continuation-in-part of Ser. No. 654,671, Sep. 26, 1984, abandoned, which is a continuation-in-part of Ser. No. 587,852, Mar. 13, 1984, abandoned, which is a continuation of Ser. No. 298,527, Sep. 1, 1981, abandoned, which is a continuation-in-part of Ser. No. 652,680, Sep. 19, 1984, abandoned, which is a continuation-in-part of Ser. No. 317,848, Nov. 3, 1981, abandoned.

[30] Foreign Application Priority Data

| Dec. 26, 1980 | [JP] | Japan | 55-186364 |
| Dec. 26, 1980 | [JP] | Japan | 55-186365 |
| Jan. 6, 1981 | [JP] | Japan | 56-858 |
| Feb. 23, 1981 | [JP] | Japan | 56-25873 |
| Apr. 7, 1981 | [JP] | Japan | 56-52718 |

[51] Int. Cl.⁴ .............................................. H05K 3/34
[52] U.S. Cl. ................................ 228/180.2; 228/37; 228/260
[58] Field of Search ............... 228/37, 180.1, 180.2, 228/260

[56] References Cited

U.S. PATENT DOCUMENTS

| 2,993,272 | 7/1961 | Carlzen et al. | 228/37 |
| 3,216,642 | 11/1965 | De Verter | 228/37 |
| 3,439,854 | 4/1969 | Walker | 228/180.1 |
| 3,482,755 | 12/1969 | Raciti | 228/37 |
| 3,713,876 | 1/1973 | Lavric | 228/37 X |
| 3,834,015 | 9/1974 | Di Renzo | 228/180.1 |
| 3,921,888 | 11/1975 | Elliott et al. | 228/180.1 |
| 3,989,180 | 11/1976 | Tardoskegyi | 228/180.1 |
| 3,993,235 | 11/1976 | Boynton | 228/37 |
| 4,101,066 | 7/1978 | Corsaro et al. | 228/180.1 |
| 4,139,881 | 2/1979 | Shimizu et al. | 228/180.1 X |
| 4,530,457 | 7/1985 | Down | 228/180.2 |

FOREIGN PATENT DOCUMENTS

| 5332854 | 3/1978 | Japan | 228/37 |
| 163073 | 12/1981 | Japan | 228/37 |
| 395197 | 1/1974 | U.S.S.R. | 228/37 |
| 627934 | 8/1978 | U.S.S.R. | 228/37 |
| 1099330 | 1/1968 | United Kingdom | 228/37 |

OTHER PUBLICATIONS

IBM Bulletin, *Nozzle for Flow Soldering Machines*, vol. 2, No. 2, Aug. 1959, p. 25, by E. W. Pringle.

*Primary Examiner*—Kenneth J. Ramsey
*Attorney, Agent, or Firm*—Wenderoth, Lind & Ponack

[57] ABSTRACT

At least one chip type component is soldered to a printed circuit board by independent first and second nozzles which spout molten solder so as to form respective first and second solder waves, with the printed circuit board sequentially passed through the first and second nozzles. The first and second solder waves define therebetween a space and flow at least in a direction of movement of the printed circuit board and in a direction counter to the direction of movement of the printed circuit board, respectively. The second nozzle is disposed at a level higher than the first nozzle such that the printed circuit board is moved obliquely upwardly.

29 Claims, 15 Drawing Sheets

Fig. 17a
Fig. 17b
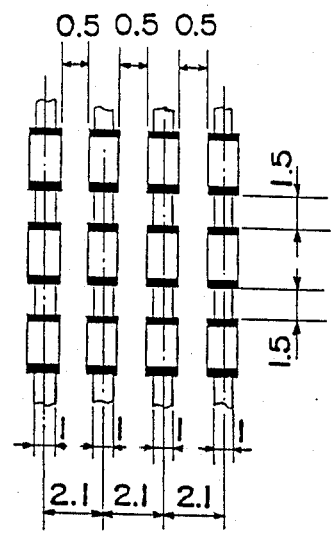
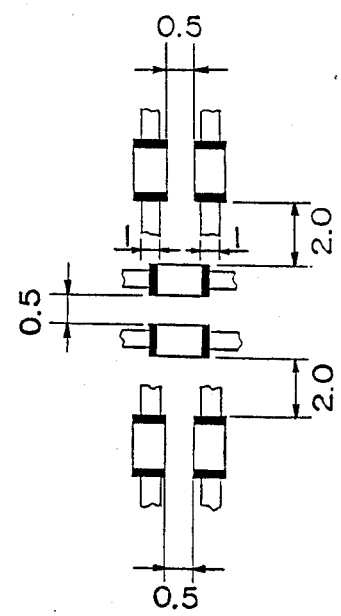

PROCESS AND APPARATUS FOR SOLDERING PRINTED CIRCUIT BOARDS

CROSS-REFERENCE TO RELATED APPLICATIONS

This is a continuation-in-part of application Ser. No. 654,671, filed Sept. 26, 1984 (now abandoned), which is a continuation-in-part of application Ser. No. 587,852, filed Mar. 13, 1984 (now abandoned), which is a continuation of application Ser. No. 298,527, filed Sept. 1, 1981 (now abandoned), and this also is a continuation-in-part of application Ser. No. 652,680, filed Sept. 19, 1984 (now abandoned) which is a continuation-in-part of application Ser. No. 317,848, filed Nov. 3, 1981 (now abandoned).

BACKGROUND OF THE INVENTION

The present invention generally relates to a soldering process and apparatus dealing with printed circuit boards having mounted thereon chip type elements or components without leads, such as resistors, capacitors or the like.

For soldering of the chip type components referred to above, there conventionally has been employed a spouting type soldering system in which soldering is effected by spouting or applying molten solder onto a soldering surface of a printed circuit board during movement of the printed circuit board. Such spouting type soldering system broadly is divided into two systems according to configurations of the spouting solder waves, i.e. one system referred to as a dual or double direction solder wave spouting type in which the solder wave is formed into an approximately symmetrical configuration with respect to a spouting port or nozzle for the molten solder, and another system referred to as a single direction solder wave spouting type which provides a solder wave flowing in a direction counter to the direction of movement of the printed circuit board.

Both of these known soldering systems, however, have serious disadvantages inherent therein. More specifically, in the former double direction solder wave spouting type system, a solder wave 2 is spouted from a nozzle 1 in a symmetrical configuration as shown in FIG. 1, while a printed circuit board 4, on which chip type components 3 are mounted, is moved from left to right as indicated by an arrow in FIG. 1. In the above arrangement, however, when the circuit board 4 leaves or exits from the solder wave 2, molten solder of the solder wave 2 tends to flow down in the same direction as the direction of movement of the printed circuit board 4, with excessive solder adhering to the chip type components 3, and thus, as shown in FIG. 2, excessive solder paddings, i.e. fillets 9 higher in height than the chip type components 3, are undesirably formed between electrode portions 6 of the chip type components 3 mounted on the printed circuit board 4 by a bonding agent 5 and conductor portions 8 of the circuit board 4 surrounded by a solder resist layer 7. As is seen from the graph of FIG. 3, when the finished printed circuit board 4 is subjected to deformation (bending) due to application of an external force or heat, cracks are readily formed within the chip type components 3, which are rigidly connected to the circuit board 4 by the excessive solder paddings 9, leading to possible deterioration of the characteristics thereof, and thus giving rise to malfunctions of the circuit when the circuit board 4 is incorporated into electronic appliances or other products.

On the other hand, in the single direction solder wave spouting type proposed to prevent the formation of the excessive solder paddings referred to above, as shown in FIG. 4, a single solder wave 11 flows from a nozzle 10 in a direction counter to the direction of movement of the printed circuit board 4, while the circuit board 4 passes through the solder wave 11 along a path inclined upwardly with respect to the direction of movement thereof. In the above arrangement, when the circuit board 4 exits from the solder wave 11, molten solder of the solder wave 11 flows down in a direction counter to the direction of the circuit board movement so as to be dragged into solder wave 11, without forming excessive paddings or fillets. In the above arrangement, however, since the solder wave 11 is directed only to one side of the chip type components 3, i.e. in a direction from right to left as shown in FIG. 4, although a normal solder padding 13 not exceeding the height of the chip type component 3 is obtained at the forward portion 12 of each component 3 with respect to the advancing direction of the circuit board 4 as shown in FIG. 5, gas of flux evaporated during the soldering operation undesirably stays at the rear portion 14 of the component 3 without being removed therefrom, and thus no molten solder adheres to such rear portion 14, thereby inevitably requiring correction by further manual solder padding work at a later stage of processing.

As is seen from the foregoing description, in both of the conventional spouting type soldering systems, faulty soldering tends to take place, thus undesirably necessitating corrections by manual operations, in which case there occurs the possibility of a still more serious problem in that the chip type component is liable to be damaged by local heat applied thereto by a soldering iron employed for the repairing operation. Therefore, there has been a demand to provide a soldering process for chip type components in which faulty soldering is eliminated, without the necessity for corrections at later stages of processing.

In the course of repeated research for ways to eliminate the necessity of corrections as described above through removal of faulty soldering, the present inventors have also made investigations into the method as disclosed, for example, in U.S. Pat. No. 4,101,066 in which a printed circuit board is brought into contact with two independent solder waves by being passed therethrough. The second solder wave flows in the same direction as that of the movement of the printed circuit board, but as a result it has been found that even the prior art process of U.S. Pat. No. 4,101,066 is not fully effective for the solution of such soldering defects as bridges or short circuits, etc., due to the large size of the solder paddings adhering to the chip type components.

SUMMARY OF THE INVENTION

In order to overcome the disadvantages described above, through further investigations and experiments made into the above and other problems, the present inventors have succeeded in developing an improved soldering process and apparatus whereby no corrections are required to eliminate faulty soldering of chip type components.

Accordingly, an essential object of the present invention is to provide an improved soldering process in which no manual corrections or repairs are required at later stages of processing, through elimination of faulty soldering of chip type components.

Another important object of the present invention is to provide a soldering apparatus which is capable of readily effecting the soldering process described above at high efficiency, even when chip type components of small size are mounted at high density on the printed circuit boards.

A further object of the present invention is to provide a soldering apparatus of the above described type which is simple to construct, which functions accurately at high reliability, and which readily can be introduced into a production line at low cost.

In accomplishing these and other objects according to one preferred embodiment of the present invention, there is provided a process of soldering printed circuit boards including the steps of supplying molten solder through independent first and second nozzles so as to flow out therefrom, and effecting soldering by passing a printed circuit board through the solder in the order of the first nozzle and the second nozzle, the improvement including the steps of forming a first solder wave from the first nozzle at least in the direction of movement of the printed circuit board, and forming at the second nozzle, a second solder wave higher in height than the first solder wave and flowing out from the second nozzle at least in a direction counter to the direction of movement of the printed circuit board, with the printed circuit board being moved in an inclined state so that the surface thereof contacts the first and second solder waves flowing from the first and second nozzles, while there is also provided an apparatus for soldering the printed circuit boards for efficiently carrying out such soldering process even when small chip type components are mounted at high density on the printed circuit boards.

By the process and apparatus according to the present invention as described above, since expulsion of flux gas from the printed circuit board and avoidance of the formation of excessive solder paddings continuously occur, manual corrections of soldering, etc., at later stages of processing have been made unnecessary, with substantial elimination of disadvantages inherent in conventional processes and apparatuses of this general type.

BRIEF DESCRIPTION OF THE DRAWINGS

The above and other objects, features and advantages of the present invention will become apparent from the following description of preferred embodiments thereof, with reference to the accompanying drawings, in which:

FIG. 15 is a perspective view indicating the flow of the second solder wave of the second nozzle of FIG. 12a;

FIGS. 17a and 17b are views explanatory of arrangements of chip type components on a printed circuit board in experiments conducted on the second nozzles of FIGS. 13, 15 and 16b;

FIG. 18a is a view similar to FIG. 10b, particularly showing the second nozzle of FIG. 12a;

FIG. 18b is an enlarged detailed view of a portion S in FIG. 18a;

FIG. 21b is an enlarged detailed view of a portion T in FIG. 21a; and

Before the description of the present invention proceeds, it is to be noted that like parts are designated by

DETAILED DESCRIPTION OF THE INVENTION

Figure 1:
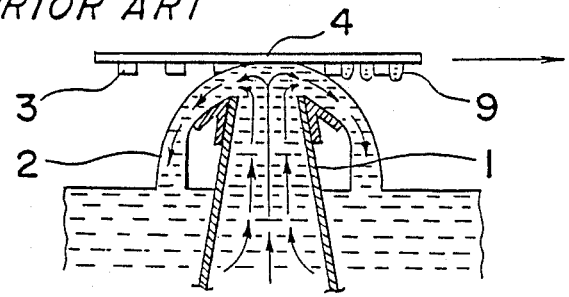
FIG. 1 is a schematic side sectional view explaining the relation between solder waves and chip type components in a conventional horizontal double direction solder wave spouting type soldering system (discussed above)
Figure 2:
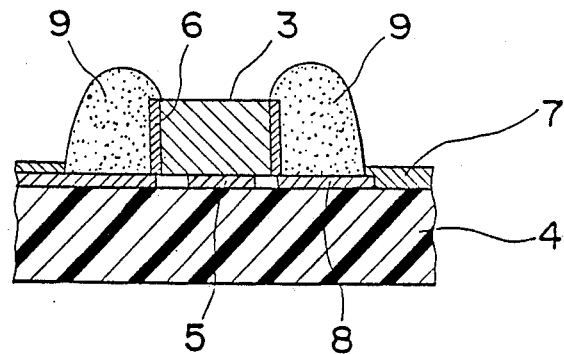
FIG. 2 is a fragmentary side sectional view on an enlarged scale of a printed circuit board processed in the system of FIG. 1, showing faulty soldering resulting therefrom (discussed above)
Figure 3:
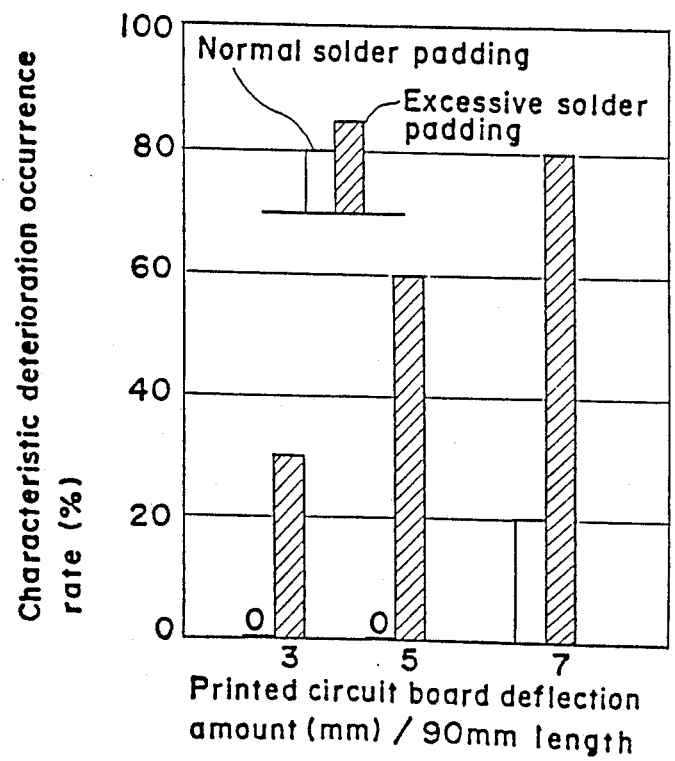
FIG. 3 is a graph showing the relation between the amount of deformation of the printed circuit board and the characteristic deterioration occurrence rate of the chip type components (discussed above)

Referring now to the drawings, there is shown in FIGS. 6a to 11 a double nozzle type soldering apparatus according to one embodiment of the present invention, which includes a first nozzle 15, 19, 21, 23 or 28 in a first solder tank and a second nozzle 16, 20, 24 or 29 in a second solder tank, with a space between the first and second nozzles, it is to be noted that a bent portion 17 (FIG. 6a) inclined at an angle P in the first nozzle 15, the first nozzle 19 (FIG. 6b) inclined at an angle Q and a bent portion 22 (FIG. 7) inclined at an angle R in the first nozzle 21 are provided to make the flow of a first solder wave spouted from the first nozzle turbulent and to accelerate the flow of the first solder wave in direction F of movement.

Figure 8A:
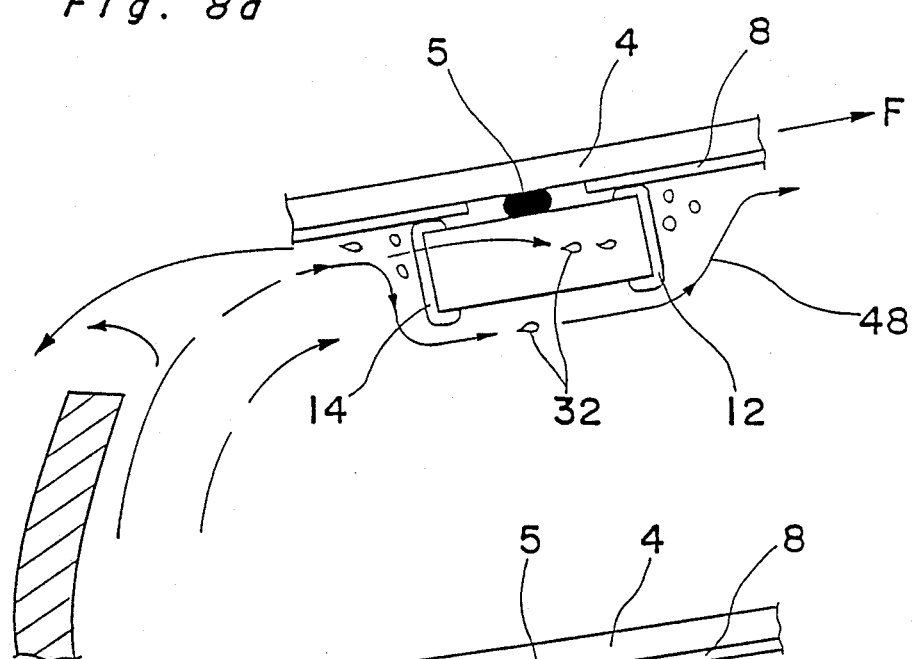
FIG. 8a is a schematic view explanatory of the relation between a first solder wave spouted from the first nozzle of this embodiment of the present invention and a chip type component of a printed circuit board.
Figure 8B:
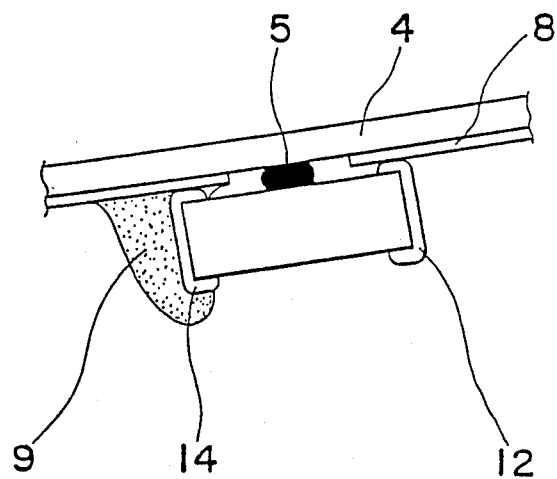
FIG. 8b is a schematic view showing the state of faulty soldering liable to take place at the first nozzle of this embodiment of the present invention.
Figure 9A:
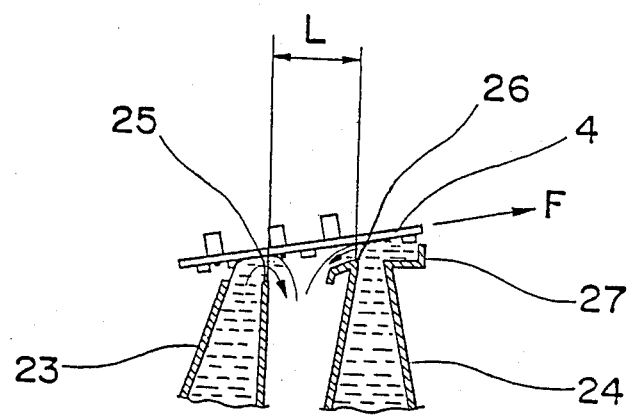
FIGS. 9a and 9b are views similar to FIG. 6a, particularly showing two examples of a space provided between the first and second nozzles of this embodiment of the present invention.
Figure 9B:
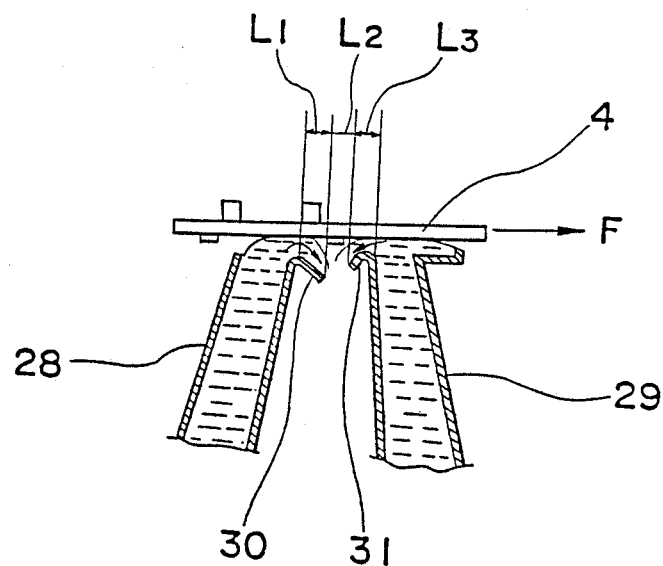

Actions which are exerted on a chip type component mounted on the printed circuit board 4 by the first solder wave of the first nozzle are shown in FIG. 8a. The chip type component is bonded to the printed circuit board 4 by bonding agent 5. At the first nozzle, a solder resist layer and flux of the printed circuit board are gasified by the first solder wave proceeding in the direction F of movement of the printed circuit board 4. Thus, bubbles stay at forward and rearward electrodes 12 and 14, especially at the forward electrode 12 of the chip type component, thereby resulting in dewetting of solder at the forward electrode 12 as shown in FIG. 8b. However, it is possible to repair the dewetting of solder at the forward electrode 12 by employing a double nozzle construction as will be described later. As shown in FIG. 8b, the first solder wave of the first nozzle is of such a strength, i.e. speed and pressure, as to form an excessive solder padding 9 at the rearward electrode 14 and to expel the flux gas from the rearward electrode 14 by the use of the bent portion 17, 22, etc. Since the flux gas expelled at the first nozzle must be removed from the printed circuit board, a space having a distance L (L=L1+L2+L3) is provided between the first and second nozzles as shown in FIGS. 9a and 9b. At the space between the first and second nozzles, all the chip type components of the printed circuit board exit from the first solder wave into the air so as to release the flux gas therefrom during conveyance of the printed circuit board from the first nozzle to the second nozzle. In FIG. 9b, the first and second nozzles 28 and 29 are formed with respective bent portions 30 and 31 confronting each other. It is possible to delete the bent portion 30 of the first nozzle, as shown in FIG. 9a. However, if the bent portion 31 of the second nozzle is deleted, a second solder wave spouted from the second nozzle will be turbulent, so that it becomes impossible to finely solder the chip type components to the printed circuit board. Furthermore, as shown in FIG. 9a, it is desirable that an uppermost port 25 of the first nozzle 23 is at a lower level than an uppermost port 26 of the second nozzle 24 and that the second nozzle 24 is formed with a solder dam 27 such that the second solder wave flows smoothly, as will be described hereinbelow.

Figure 10A:
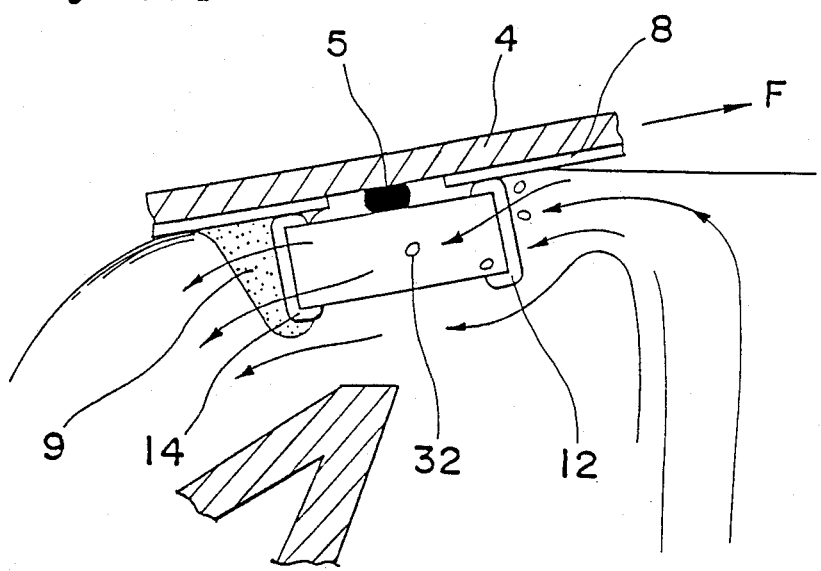
FIGS. 10a, 10b and 11 are schematic views explanatory of the relation between a second solder wave spouted from the second nozzle of this embodiment of the present invention and a chip type component of the printed circuit board.
Figure 10B:
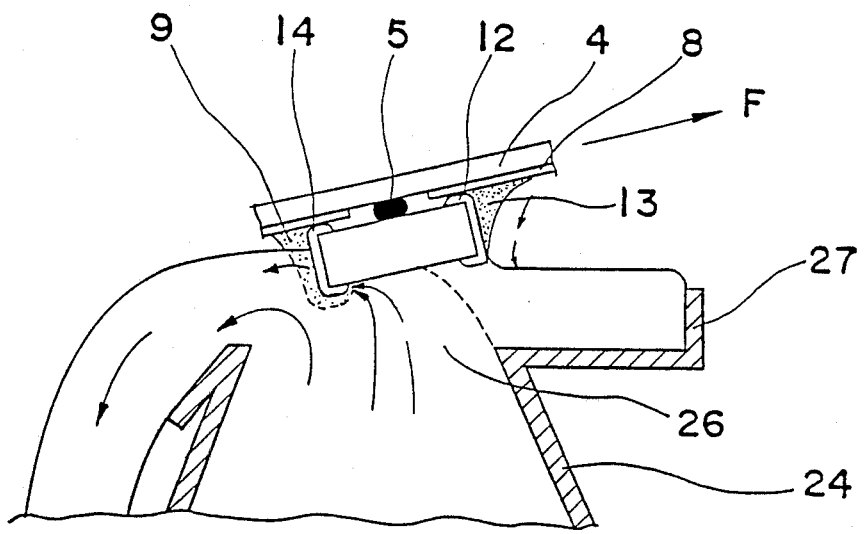
Figure 11:
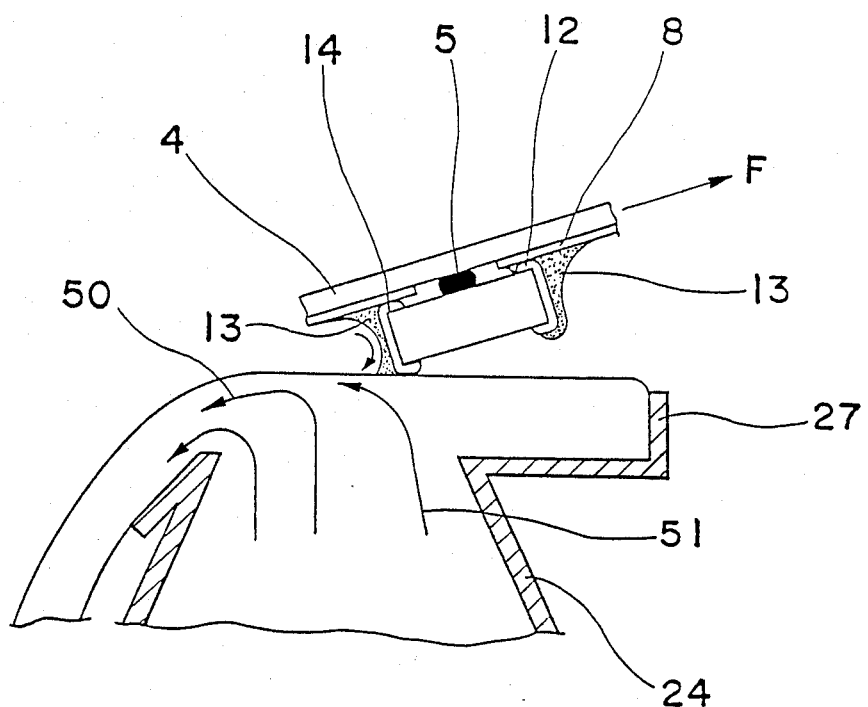

At the second nozzle, such soldering steps as shown in FIGS. 10a, 10b and 11 are carried out. Initially, as shown in FIG. 10a, the chip type component secured to conductor portions 8 of the printed circuit board by both the bonding agent 5 for temporarily attaching the chip type component to the printed circuit board and the excessive solder padding 9 formed at the rearward electrode 14 by the first nozzle is soldered, at the forward electrode 12, to the printed circuit board 4 while expelling flux gas from area of the forward electrode 12. Then, as shown in FIG. 10b, since the forward electrode 12 is first carried upwardly at an oblique angle of the printed circuit board 4 from a solder well formed by the solder dam 27 which is disposed forwardly of the second nozzle in the direction F of movement of the printed circuit board 4, a normal solder padding 13 is formed at the forward electrode 12 due to the weight of the solder adhering to the forward electrode 12 and interfacial tension of the solder of the solder well of the solder dam 27. Meanwhile, as shown in FIG. 11, the excessive solder padding 9 formed at the rearward electrode 14 is also formed into a normal solder padding 13 by the weight of the solder adhering to the rearward electrode 14 and the interfacial tension of the solder of the solder well when the rearward electrode 14 exits from the solder well. Thus, it will readily be understood from the foregoing that, at the second nozzle, the forward electrode 12 is soldered to the printed circuit board by expelling flux gas therefrom and the excessive solder padding 9 is scraped from the rearward electrode 14.

Figure 12A:
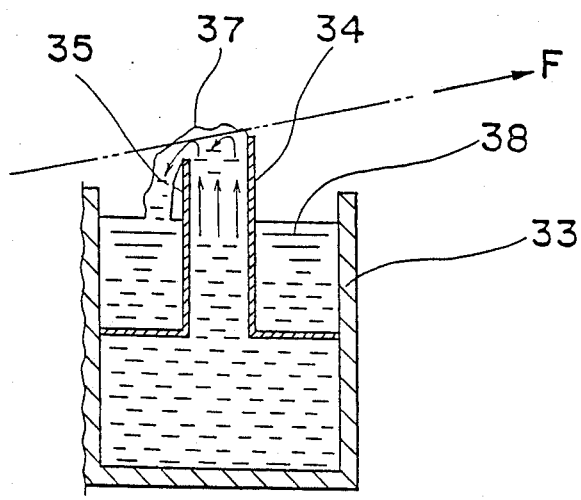
FIGS. 12a and 12b are cross-sectional views showing two comparative second nozzles not constructed according to the present invention.
Figure 12B:
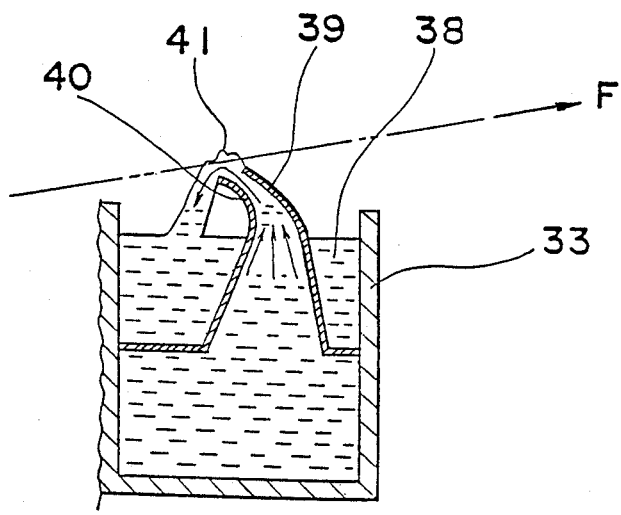
Figure 13:
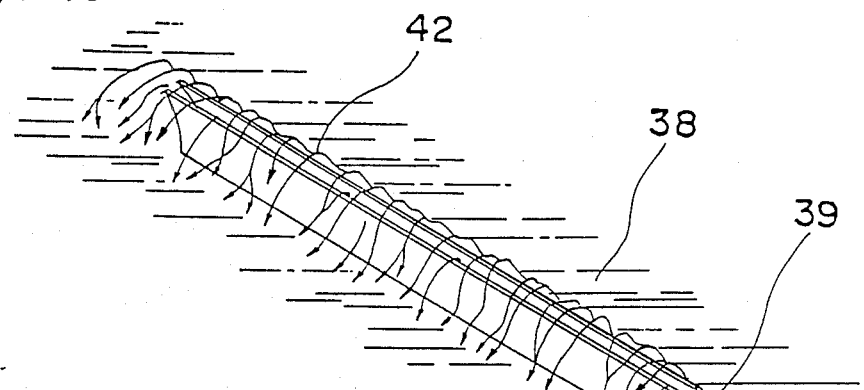
FIG. 13 is a perspective view indicating the flow of the second solder wave of the second nozzle of FIG. 12b.
Figure 14:
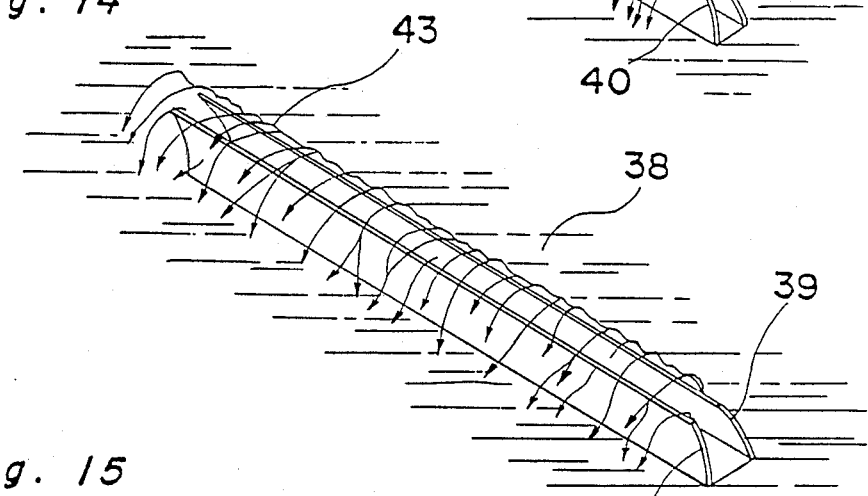
FIG. 14 is a view similar to FIG. 13, but of a modification of the nozzle thereof.
Figure 15:
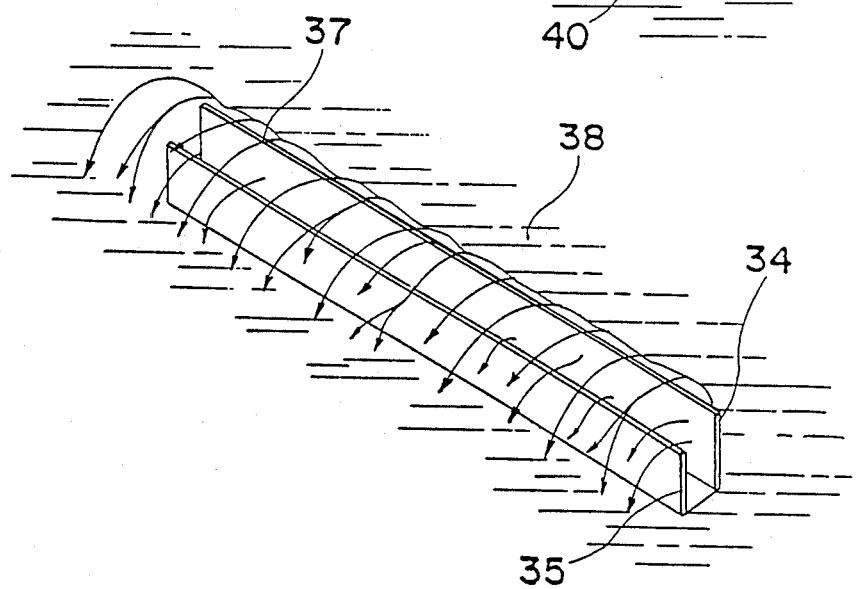

Hereinbelow, the necessity of the solder dam 27 for soldering the chip type component to the printed circuit board will be described with reference to FIGS. 12a to 18. FIGS. 12a and 12b show two comparative second nozzles not constructed according to the present invention. In FIG. 12a, the second nozzle is formed with a rectangular opening and has a downstream or forward wall 34 and an upstream or rearward wall 35 with respect to the direction F of movement of the printed circuit board. The forward wall 34 is set to be at a level higher than the rearward wall 35 such that a single direction spouting type second solder wave 37 is formed. Meanwhile, in FIG. 12b, the second nozzle is also formed with a rectangular opening and has a forward wall 39 and a rearward wall 40. The forward wall 39 and the rearward wall 40 are curved in a direction opposite to the direction F of movement of the printed circuit board so as to converge in a direction toward the opening of the second nozzle such that a strong second solder wave 41 is spouted from the opening. As shown in FIG. 13, a turbulent and uneven second solder wave 42 is spouted from the second nozzle of FIG. 12b having a restricted construction of the opening. Even if the opening of the second nozzle of FIG. 12b is increased in width as shown in FIG. 14, it was found that a considerably uneven second solder wave 43 is spouted from the second nozzle. Furthermore, in the case of the second nozzle of FIG. 12a having a large opening without any restricted construction, the second solder wave 37 is more smooth but still considerably uneven as shown in FIG. 15. On the other hand, referring to FIGS. 16a and 16b, even second solder waves 44 and 45 each having a smooth upper face are spouted from second nozzles constructed according to the present invention. Such a characteristic of the second nozzle of the present invention as the smooth second solder wave is especially necessary for soldering chip type components to a printed circuit board in view of a recent trend that the chip type components are becoming further miniaturized, with a height of only a few millimeters.

Hereinbelow, experiments conducted on the second nozzles of FIGS. 13, 15 and 16b will be described with reference to FIGS. 17a and 17b and Tables 1 and 2. It is to be noted that FIGS. 17a and 17b show arrangements of the chip type components on the printed circuit board employed in the experiments.

TABLE 1

| Soldering Conditions | |
|---|---|
| Flux | "JS-64MSC" (name used in trade and manufactured by San-ei Kagaku Co., Ltd. of Japan), Specific gravity = 0.835 |
| Preheater | Preheater (No. 1) = 110° C., Preheater (No. 2) = 110° C., Temp. of underside of printed circuit board = 90–100° C. |
| Solder temp. | First nozzle = 250° C., Second nozzle = 250° C. |
| Solder dipping time | 3 sec. |
| Solder material | Rod solder of H63A (JIS) |
| Conveyor speed | 1.2 m/min. |
| Oblique angle of printed circuit board | 6° |

Furthermore, in Table 2, the printed circuit board is made of paper phenol and has a width of 80 mm, a length of 150 mm and a thickness of 1.6 mm. Meanwhile, ten such printed circuit boards each mounted with a total of 49 chip type components composed of 1 transistor, 6 capacitors and 42 resistors were examined for each of the second nozzles of FIGS. 13, 15 and 16b.

TABLE 2

Figure 16A:
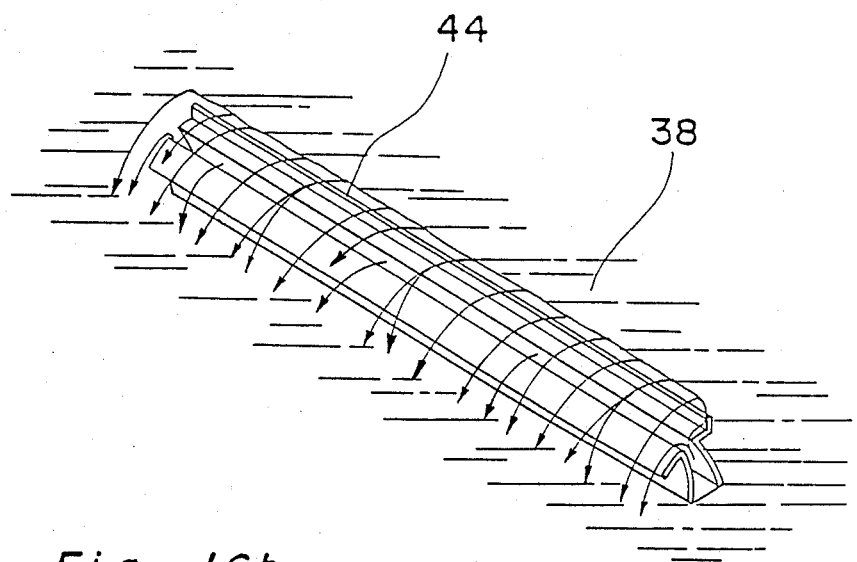
FIGS. 16a and 16b are perspective views indicating the flow of the second solder wave of the second nozzle of the present invention.
Figure 16B:
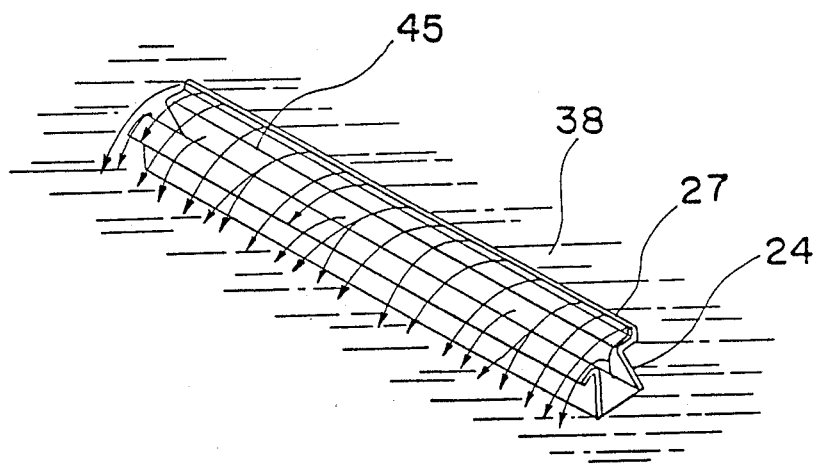

| | Soldering Experiments | | | |
|---|---|---|---|---|
| Second nozzle | *Direction of movement of printed circuit board | Solder bridge (%) | Excessive solder padding (%) | **Total percent defective (%) |
| FIG. 13 | A | 1.2 | 2.4 | 3.6 |
|  | B | 3.3 | 4.1 | 7.4 |
| FIG. 15 | A | 1.4 | 2.0 | 3.4 |
|  | B | 2.7 | 4.1 | 6.8 |
| FIG. 16b | A | 0 | 2.0 | 2.0 |
| (Present invention) | B | 0 | 0 | 0 |

Note
*Characters A and B denote directions of movement of the printed circuit board, in which the printed circuit board is fed in sidewise and longitudinal directions in FIG. 17, respectively.
**A total percent defective is given by the equation:

Total percent defective (%) = $\frac{\text{number of defective components}}{\text{total of components}} \times 100$ It will be readily seen from Table 2 that the nozzle of the present invention has such advantages that excessive solder paddings seldom occur and no solder bridges occur. Consequently, it will be concluded that the second solder wave of the second nozzle must flow smoothly and that the solder well formed by the solder dam 27 plays a vital role in soldering the chip type components to the printed circuit board.

Figure 18A:
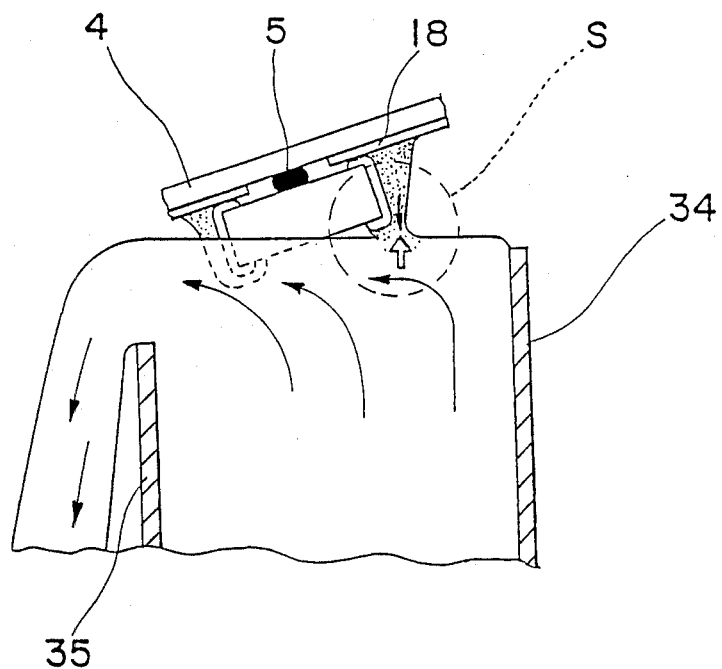
Figure 18B:
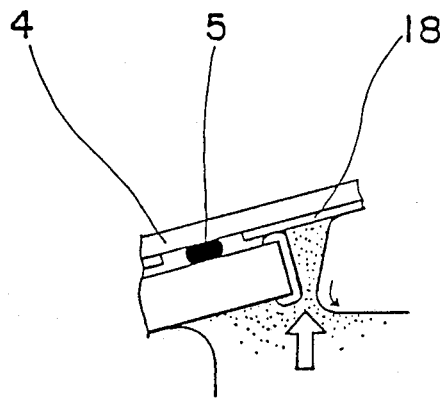

More specifically, referring to FIGS. 18a and 18b, there is shown soldering of a chip type component by the use of the second nozzle of FIG. 15. When the forward electrode of the chip type component exits from the surface of the second solder wave, a flow of the second solder wave, which proceeds towards the electrode, is produced at an interface between the electrode and the surface of the second solder wave. Namely, as shown in FIG. 18b it is surmised that a solder pressure indicated by the blank arrow is applied to each of the electrodes, thereby resulting in formation of excessive solder paddings.

Figure 19A:
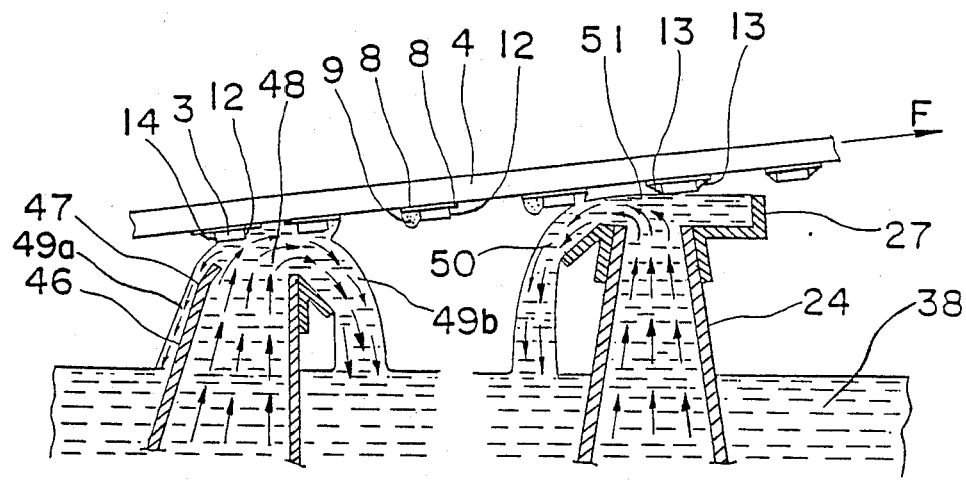
FIGS. 19a and 19b are a partial cross-sectional view and a cross-sectional view, respectively, of a soldering apparatus according to a modified embodiment of the present invention.
Figure 19B:
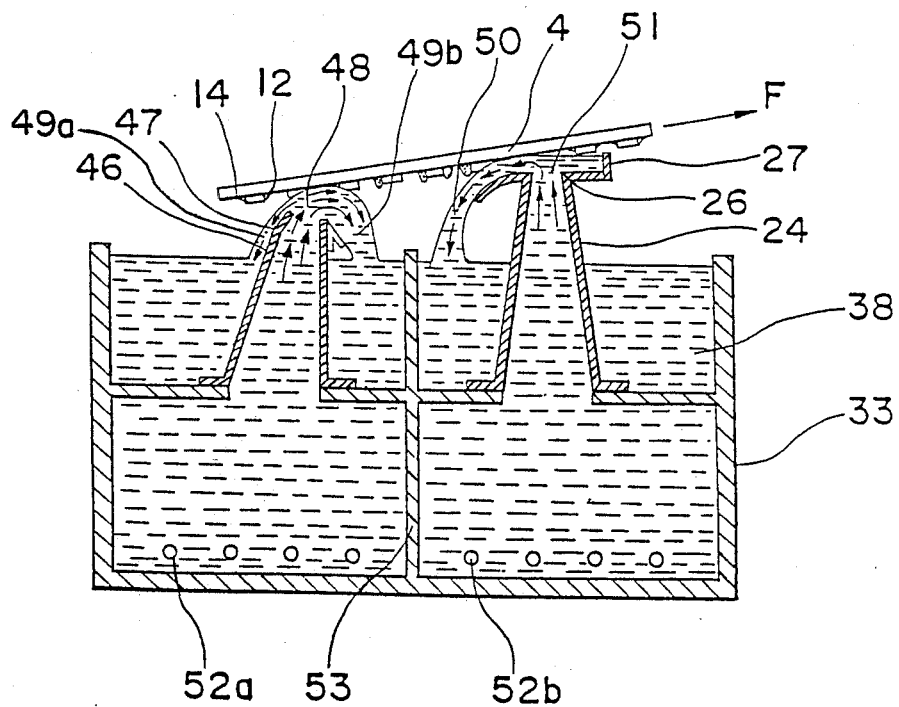
Figure 20:
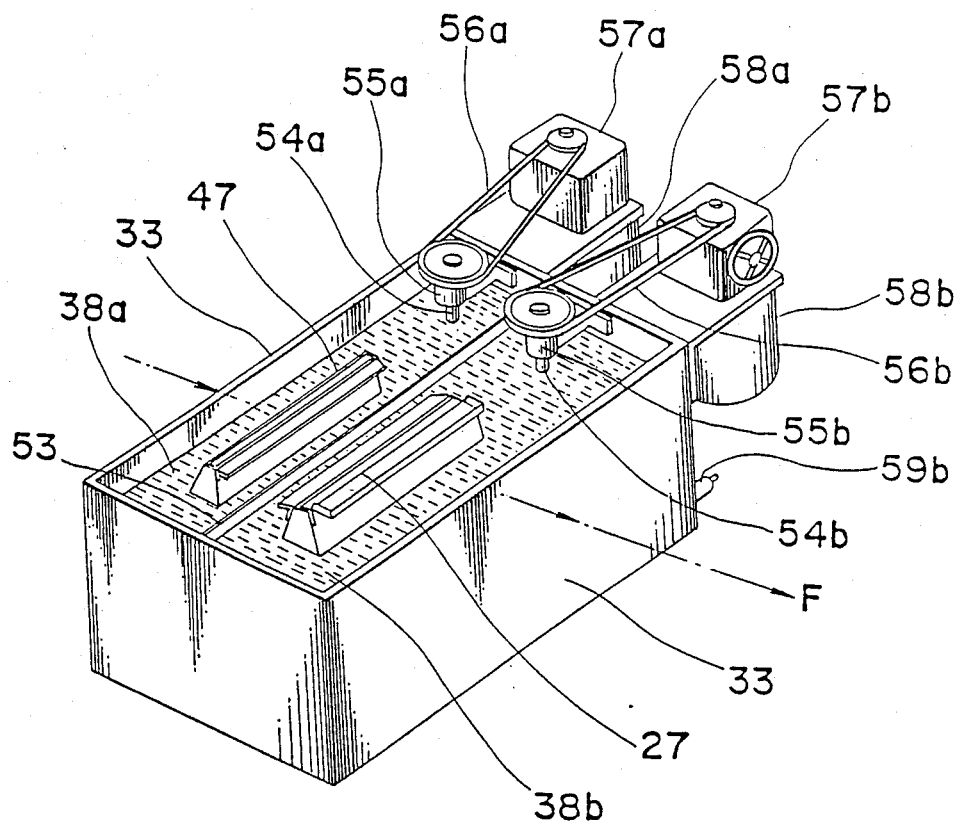
FIG. 20 is a perspective view of such soldering apparatus of the present invention.

Referring now to FIGS. 19a, 19b and 20, there is shown a modification of the double nozzle type soldering apparatus of FIGS. 6 to 11 wherein, as indicated above, it is possible to avoid dewetting of solder at the forward electrode 12. In FIGS. 19a and 19b, the printed circuit board 4, on which chip type components 3 are mounted, is advanced in the direction indicated by the arrow F and passes through both rearward and forward solder waves 49a, 49b issuing from the first nozzle 46 and then through a solder wave 50 issuing from the second nozzle 24. The molten solder 48 forming the first rearward and forward solder waves 49a, 49b flows down from a spouting port of the first nozzle 46 in directions opposite to and in the direction of movement of the printed circuit board 4. When the chip type component 3 passes through rearward solder wave 49a and then exits from the forward solder wave 49b, the solder wave 49a is applied to the forward portion 12 and the solder wave 49b is applied to the rear portion 14 of the chip type component 3. This results in the formation of respective excessive solder paddings or fillets 9 thereat by expelling the flux gas developed. The excessive solder padding 9 at rear portion 14 particularly is formed since the solder wave 49b is accelerated in the direction of movement of the printed circuit board 4 by bent portion 47 and the direction of flow of the solder wave 49b is the same as the direction of movement of the printed circuit board 4. The force of rearward solder wave 49a is sufficient at least to expel flux gas.

Figure 22:
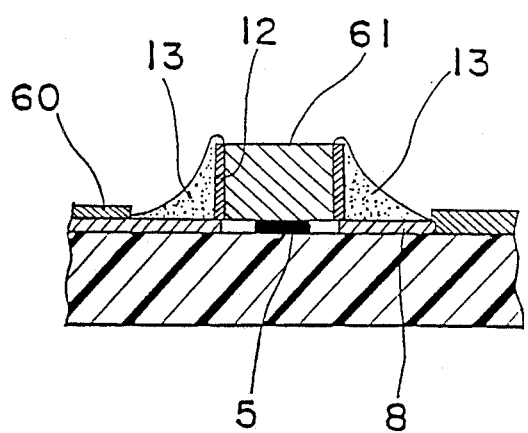
FIG. 22 is a cross-sectional view of a chip type component soldered to a printed circuit board by the soldering process and apparatus of the present invention.

Meanwhile, at the second nozzle 24, molten solder 51 spouted from a spouting port 26 of the second nozzle 24 is checked or stopped by a check or dam portion 27 provided at the upper front edge of the second nozzle 24 (FIGS. 19a and 19b), and flows down in a direction counter to the direction of movement of the printed circuit board 4 in the form of a second solder wave 50. In the above case, if the second solder wave 50 formed by the second nozzle 24 is higher than the first solder waves 49a, 49b, with the printed circuit board 4 being adapted to enter the second solder wave 50 and leave the solder well in a state where it is inclined or raised upwards with respect to the advancing direction thereof, the excessive solder paddings 9 formed on the chip type component 3 by the first solder waves 49a, 49b of the first nozzle 46 are removed or scraped off by the second solder wave 50, especially the solder well of the second nozzle 24 and thus, the excessive solder paddings 9 are rectified or corrected into normal solder paddings 13 of a small size as shown in FIG. 22.

As is seen from the foregoing description, according to the soldering process in FIGS. 19a and 19b of the present invention, such drawbacks as formation of excessive solder paddings or fillets or dewetting of solder, etc., encountered in the conventional processes are advantageously eliminated, and optimum solder fillets of a small size not exceeding the height of the chip type component may be obtained, without requiring manual repairs or corrections at later stages of processing.

Figure 21A:
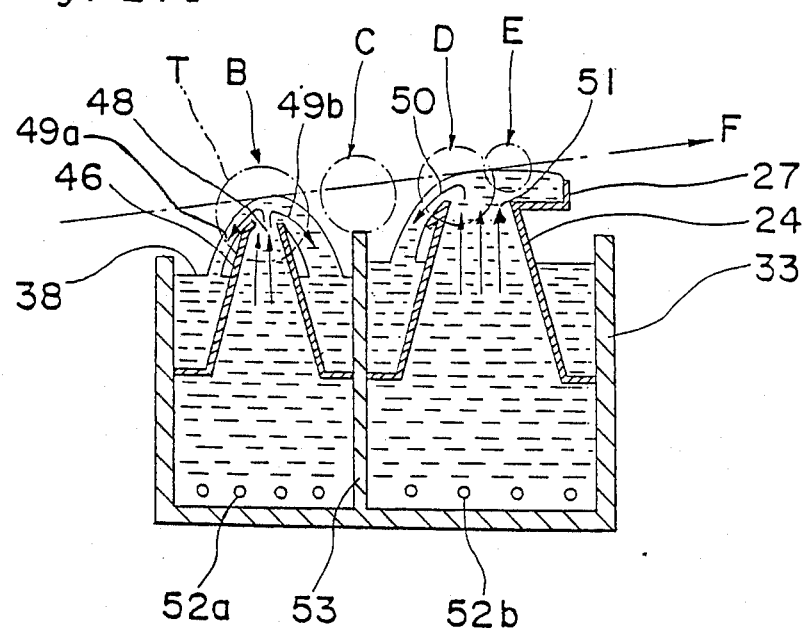
FIG. 21a is a view similar to FIG. 19b, particularly showing a soldering process conducted with an apparatus further modified to emphasize the aspect of this embodiment of the present invention.

In FIGS. 20 and 21a, a soldering apparatus for effecting an improved soldering process according to the present invention and illustrated a further modification of first nozzle 46 to form a stronger rearward solder wave 49a generally includes a housing or container 33 of a rectangular cubic box-like configuration, in which molten solder 38 is accommodated and which is divided into two similar molten solder sump portions 38a, 38b by a partition wall 53. The first solder spouting portion or nozzle 46 and the second solder spouting portion or nozzle 24 are respectively provided in the corresponding sump portions in the manner described hereinbelow. In order to cause the molten solder 38 to spout from the respective nozzles 46 and 24 in the form of solder waves, the sump portion 38a for the first nozzle 46 has heater members 52a disposed adjacent to the bottom portion thereof, a shaft 54a rotatably supported by a bearing member 55a and coupled, at its upper end, to a motor 58a through a belt and pulley drive 56a and a speed change gear 57a, while the sump portion 38b for the second nozzle 24 is similarly provided with heater members 52b, another shaft 54b rotatably supported by a bearing member 55b and coupled, at its upper end, to a motor 58b through a belt and pulley drive 56b and a speed change gear 57b, so that the solder portions 38a and 38b melted by the heater members 52a and 52b are forced into the respective nozzles 46 and 24 and spouted therefrom through rotation of impellers (not shown) driven by the motors 58a and 58b. Consequently, the first and second nozzles 46 and 24 respectively form the rearward and forward first solder waves 49a, 49b and the second solder wave 50 (FIGS. 19a and 19b) of the molten solder 38 which is discharged by the rotation of the impellers. The heights of the spouting solder waves 49a, 49b and 50 may be readily altered, since the respective motors 58a and 58b are provided with the speed change gears 57a and 57b.

The effects available by the present invention in comparison with conventional single nozzle type soldering systems are given in Table 3 below, based on the results of experiments carried out by the present inventors.

TABLE 3

Soldering Systems and Frequency of Occurrence of Soldering Faults

| Soldering system | Soldering faults | | |
|---|---|---|---|
| | Dewetting of solder | Excessive solder fillet | Solder bridge |
| Double direction wave spouting type (conventional) | 0 cases | 15 cases | 4 cases |
| Single direction wave spouting type (conventional) | 11 cases | 0 cases | 0 cases |
| Embodiment (FIG. 19b) (present invention) | 0 cases | 0 cases | 0 cases |

In the results of the above Table 3, for the comparison between the so called double direction wave spouting type and single direction wave spouting type of the conventional single nozzle type soldering systems and the improved process and apparatus according to the present invention, 20 printed circuit boards each mounted with 200 chip type components were subjected to soldering to study the frequency of occurrence of soldering faults. It is to be noted here that, "solder bridge" referred to in the above Table 3 means a soldering fault resulting from short-circuits between electrodes of neighboring chip type components which requires manual corrections at later stages of processing. From Table 3, it is noticed that no soldering faults occurred in the case of the embodiment according to the present invention.

Referring back to FIGS. 6a, 6b, 7, 9a and 9b, specific constructions of the first and second nozzles of the present invention will be described hereinbelow. Namely, as shown in FIG. 9a, the distance L between the front upper edge 25 of the first nozzle 23 and the rear upper edge 26 of the second nozzle 24 was set at 15 cm in the experiments. If the distance L is excessively short, not only will a smooth flow of the molten solder 38 not be possible, but there may be cases where the solder does not sufficiently adhere due to difficulty in efficiently releasing the gas developed during soldering. On the other hand, if the distance L is too large, the molten solder 38 tends to be undesirably spread over the upper surface of the printed circuit board 4, since the central portion of the circuit board 4 is excessively lowered or deflected downwards during passage of the board 4 through the second nozzle 24 owing to downward warping of circuit board 4 as it passes through the first nozzle 23. Accordingly, the distance L between the front upper edge 25 of the first nozzle 23 and the rear upper edge 26 of the second nozzle 24 is to be limited within a practically applicable range, and should desirably be larger than 3 cm and smaller than 20 cm, and more preferably be larger than 5 cm and smaller than 15 cm.

The above arrangement described with reference to FIG. 9a may further be modified as in FIG. 9b, in which control plates are provided in the vicinity of upper edges of the spouting ports for the nozzles for restricting the flow of the molten solder.

More specifically, in the arrangement of FIG. 9b, at the front upper edge of the first nozzle 28 and the rear upper edge of the second nozzle 29, first and second control plates 30 and 31 of predetermined shapes are respectively provided so as to extend towards each other for efficient control of the flow of the molten solder 38. In the above modification, the distance L2 between the front edge of the control plate 30 provided for the first nozzle 28 and the corresponding rear edge of the control plate 31 provided for the second nozzle 29 should be larger than 1 cm, and more preferably, larger than 2 cm. Meanwhile, on the assumption that the lengths of the control plates 30 and 31 are respectively represented by L1 and L3, it is preferable that the following relationships are satisfied:

$3\ cm \leqq L \leqq 20\ cm$ $L2 \geqq 1\ cm$ $0 \leqq L1 \leqq 19\ cm$ $0 \leqq L3 \leqq 19\ cm$ or more preferably, $5\ cm \leqq L \leqq 15\ cm$ $L2 \geqq 2\ cm$ $0 \leqq L1 \leqq 13\ cm$ $0 \leqq L3 \leqq 13\ cm$ In the above case, there is a relation represented by $L = L2 + L2 + L3$ among L, L1, L2 and L3.

Subsequently, effects available by the above embodiments are summarized in Table 4 below.

TABLE 4

| EXAMPLE NO. | L (cm) | L1 (cm) | L3 (cm) | L2 (cm) | (No. of spots) Faulty soldering 1 | (No. of spots) Faulty soldering 2 | Spreading of solder over upper surface of printed circuit board |
|---|---|---|---|---|---|---|---|
| 1 | 3 | 0 | 1 | 2 | 0 | 0 | Acceptable |

TABLE 4-continued

Figure 4:
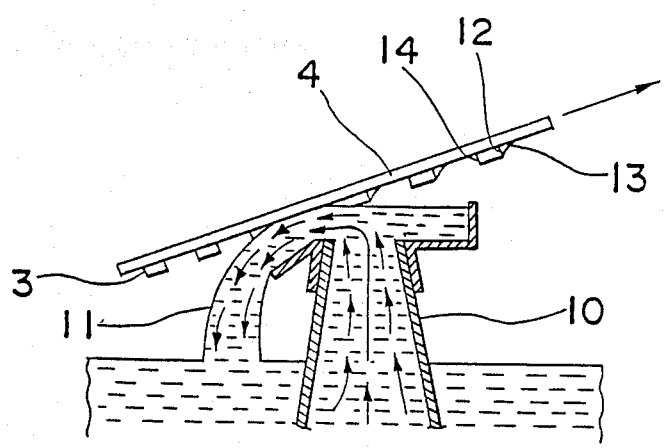
FIG. 4 is a view similar to FIG. 1, but particularly showing the relation between a solder wave and chip type components in a conventional inclined single direction solder wave spouting type soldering system (discussed above)
Figure 5:
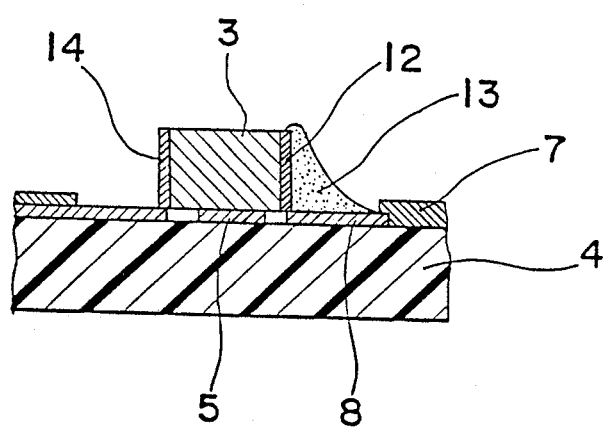
FIG. 5 is a fragmentary side sectional view on an enlarged scale of a printed circuit board processed in the system of FIG. 4, showing faulty soldering such as dewetting of solder resulting therefrom (discussed above)
Figure 6A:
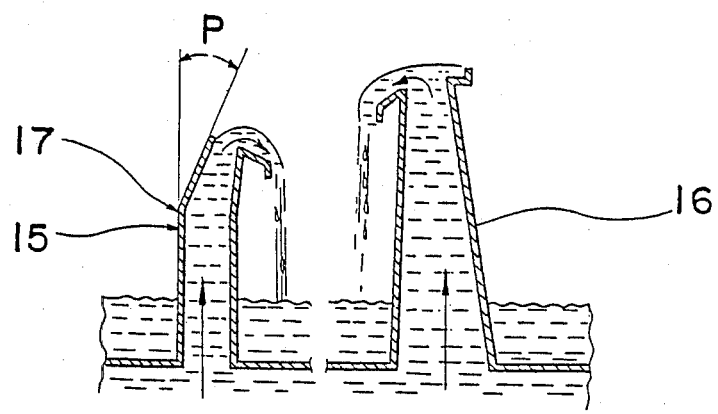
FIGS. 6a, 6b and 7 are fragmentary cross-sectional views of a soldering apparatus according to one embodiment of the present invention, particularly showing three examples of first and second nozzles employed therein.
Figure 6B:
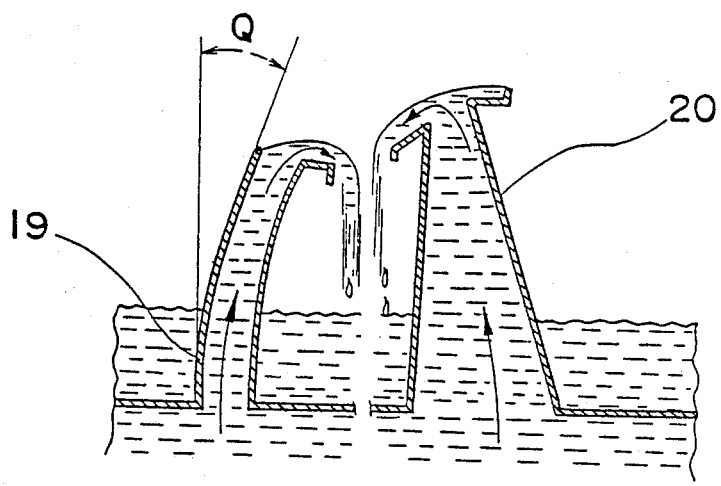
Figure 7:
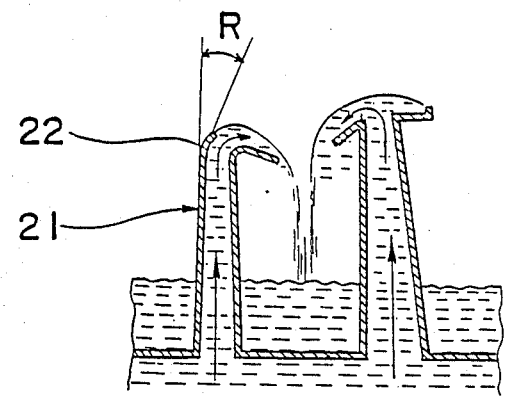

| EXAMPLE NO. | L (cm) | L1 (cm) | L3 (cm) | L2 (cm) | (No. of spots) Faulty soldering 1 | (No. of spots) Faulty soldering 2 | Spreading of solder over upper surface of printed circuit board |
|---|---|---|---|---|---|---|---|
| 2 | 5 | 0 | 1 | 4 | 0 | 0 | " |
| 3 | 7 | 0 | 1 | 6 | 0 | 0 | " |
| 4 | 10 | 0 | 1 | 9 | 0 | 0 | " |
| 5 | 15 | 0 | 1 | 14 | 0 | 0 | " |
| 6 | 20 | 0 | 1 | 19 | 0 | 0 | " |
| 7 | 5 | 0 | 2 | 3 | 0 | 0 | " |
| 8 | 5 | 0 | 3 | 2 | 0 | 0 | " |
| 9 | 5 | 1 | 2 | 2 | 0 | 0 | " |
| 10 | 5 | 1 | 3 | 1 | 0 | 0 | " |
| 11 | 5 | 2 | 1 | 2 | 0 | 0 | " |
| Comparative data 1 | 2 | 0 | 1 | 1 | 5 | 0 | " |
| Comparative data 2 | 21 | 0 | 1 | 20 | 0 | 0 | Not acceptable |
| Comparative data 3 | 25 | 0 | 1 | 24 | 0 | 0 | Not acceptable |
| Conventional arrangement 1 (FIG. 1) | | | | | 1 | 13 | Acceptable |
| Conventional arrangement 2 (FIG. 4) | | | | | 8 | 4 | Acceptable |

In the results of experiments given in the above Table 4, paper phenol boards each 1.6 mm in thickness were employed for the printed circuit boards. "Faulty soldering 1" represents faults in which solder does not adhere to or wet the land or chip type component, while "Faulty soldering 2" denotes faults due to excessive amounts of solder fillets or solder bridge faults. One hundred and twenty-five chip type components were mounted on each printed circuit board, with the results being represented on the average of five printed circuit boards. Meanwhile, the inclination of the first nozzle in the vicinity of the spouting port thereof may be so selected that the molten solder properly flows out through said spouting port at least in the direction of movement of said printed circuit board.

Referring back to FIGS. 6 and 7, the tangential angles P, Q and R at the rear edges of the first nozzles 15, 19 and 21 of various shapes, in the vicinity of the spouting ports thereof, should suitably be 2° to 80°. If the angles P, Q and R are smaller than 2°, the pressure to be applied to the electrode portion of the component is reduced as in an ordinary spouting flow, while on the contrary, if the angles P, Q and R are larger than 80°, there may arise such a problem that the end of the nozzle undesirably contacts the chip type components mounted on the printed circuit board. The above tangential angles P, Q and R should more preferably be 5° to 60°.

Figure 21B:
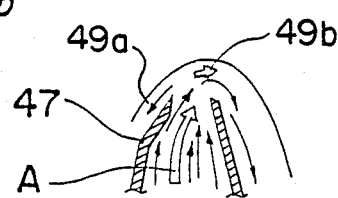

As shown in FIGS. 21a and 21b, the soldering process of the present invention includes the steps of supplying the molten solder into the independent first and second nozzles 46 and 24 so as to flow out therefrom, and effecting soldering by passing the printed circuit board in the order of the first nozzle 46 and second nozzle 24, the improvement including the steps of forming the first solder waves 49a, 49b from the first nozzle 46 at least in the direction F of movement of the printed circuit board and alternatively both forwardly and rearwardly of direction F, and forming, at the second nozzle 24, the second solder wave 50 at a level higher than the first solder waves 49a, 49b and flowing from the second nozzle 24 at least in the direction counter to the direction F of movement of the printed circuit board, with the printed circuit board being moved in an inclined state so that the surface thereof contacts the first solder waves 49a, 49b and the second solder wave 50 flowing from the first and second nozzles 46 and 24. The apparatus of the invention for soldering the printed circuit boards efficiently carries out such soldering process, even when small chip type components are mounted at high density on the printed circuit boards.

More specifically, the soldering process of the present invention includes soldering the chip type component to the printed circuit board at least in the direction of movement of the printed circuit board, releasing the flux gas from the printed circuit board, soldering the chip type component to the printed circuit board in a direction opposite to the direction of movement of the printed circuit board and reducing excessive solder paddings from the chip type component, such operations being performed in this order continuously.

In accordance with the present invention, miniature components such as chip type components can be reliably soldered to the printed circuit board at high density, with elimination of such soldering faults as dewetting of the solder, excessive solder paddings, etc.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

We claim:

1. An apparatus for soldering spaced forward and rearward electrodes of a chip type component to conductor portions printed on a circuit board, the component being mounted on the circuit board and flux being applied to the electrodes and the conductor portions, said apparatus comprising:
  means for moving the circuit board at a given speed along an upwardly inclined path with the component facing downwardly and with the forward and rearward electrodes of the component leading and trailing, respectively, in the direction of movement;
  first nozzle means positioned beneath said path for discharging a first molten solder wave at least in a forward direction with respect to said direction of movement, such that the component passes through said first solder wave, at a speed greater than said given speed, and thereby for applying molten solder at least between the rearward electrode and a respective conductor portion and expelling therefrom flux gas produced by application of said molten solder to the flux, thus forming an excessive solder padding between the rearward electrode and the respective conductor portion, said excessive padding having a height greater than and extending downwardly beyond the rearward electrode;

second nozzle means, positioned downstream of said first nozzle means with respect to said direction of movement and at a level above said first nozzle means, for discharging a second molten solder wave in a direction rearwardly with respect to said direction of movement, such that the component passes through said second solder wave, with a space between said first and second solder waves, and thereby directing said second solder wave toward the forward electrode and a respective conductor portion; and means defining a solder well extending forwardly of the outlet of said second nozzle means for maintaining stable said second solder wave, with the component passing through said solder well, and for removing excessive solder paddings formed previously on the electrodes.

2. An apparatus as claimed in claim 1, wherein said first nozzle means directs all of said first solder wave in said forward direction, and wherein said second nozzle means directs said second solder wave against the forward electrode and the respective conductor portion and expels therefrom flux gas produced by application of the molten solder against the flux, thus tending to form an excessive solder padding between the forward electrode and the respective conductor portion.

3. An apparatus as claimed in claim 1, wherein said first nozzle means directs a forward wave portion of said first solder wave in said forward direction and directs a rearward wave portion thereof in a rearward direction with respect to said direction of movement such that said rearward wave portion applies molten solder between the forward electrode and a respective conductor portion and expels therefrom flux gas produced by application of said molten solder to the flux, thus forming an excessive solder padding between the forward electrode and the respective conductor portion.

4. An apparatus as claimed in claim 1, wherein said first nozzle means includes an upstream wall inclined forwardly, thereby increasing the pressure of said first solder wave.

5. An apparatus as claimed in claim 4, wherein said wall is inclined forwardly at an angle of from 5° to 60° from the vertical.

6. An apparatus as claimed in claim 1, further comprising solder container means containing molten solder, said first and second nozzle means extending upwardly from said container means, and means for pumping molten solder from said container means through said first and second nozzle means, thereby forming said first and second solder waves.

7. An apparatus as claimed in claim 6, wherein said container means defines first and second separate sump portions associated with said first and second nozzle means, respectively.

8. An apparatus as claimed in claim 1, wherein outlet openings of said first and second nozzle means are of different sizes.

9. An apparatus as claimed in claim 8, wherein said outlet opening of said first nozzle means is smaller than said outlet opening of said second nozzle means.

10. A process for soldering spaced forward and rearward electrodes of a chip type component to conductor portions printed on a circuit board, said component being mounted on said circuit board and flux being applied to said electrodes and said conductor portions, said process comprising:

moving said circuit board at a given speed along an upwardly inclined path with said component facing downwardly and with said forward and rearward electrodes of said component leading and trailing, respectively, in the direction of movement;

discharging from a first nozzle positioned beneath said path a first molten solder wave at least in a forward direction with respect to said direction of movement, such that said component passes through said first solder wave, at a speed greater than said given speed, and thereby applying molten solder at least between said rearward electrode and a respective said conductor portion and expelling therefrom flux gas produced by application of said molten solder to said flux, thus forming an excessive solder padding between said rearward electrode and said respective conductor portion, said excessive padding having a height greater than and extending downwardly beyond said rearward electrode;

discharging from a second nozzle, positioned downstream of said first nozzle with respect to said direction of movement and at a level above said first nozzle, a second molten solder wave in a direction rearwardly with respect to said direction of movement, such that said component passes through said second solder wave, while maintaining a space between said first and second solder waves, and thereby directing said second solder wave toward said forward electrode and a respective said conductor portion; and defining a solder well extending forwardly of said outlet of said second nozzle and thus maintaining stable said second solder wave, with said component passing through said solder well, and thereby removing excessive solder paddings formed previously on said electrodes.

11. A process as claimed in claim 10, comprising directing all of said first solder wave from said first nozzle in said forward direction, and directing said second solder wave from said second nozzle against said forward electrode and said respective conductor portion and expelling therefrom flux gas produced by application of said molten solder against said flux, thus tending to form an excessive solder padding between said forward electrode and said respective conductor portion.

12. A process as claimed in claim 10, comprising directing a forward wave portion of said first solder wave in said forward direction and directing a rearward wave portion thereof in a rearward direction with respect to said direction of movement such that said rearward wave portion applies molten solder between said forward electrode and a respective said conductor portion and expels therefrom flux gas produced by application of said molten solder to said flux, thus forming an excessive solder padding between said forward electrode and said respective conductor portion.

13. A process as claimed in claim 10, comprising inclining forwardly an upstream wall of said first nozzle, and thereby increasing the pressure of said first solder wave.

14. A process as claimed in claim 13, wherein said wall is inclined forwardly at an angle of from 5° to 60° from the vertical.

15. Apparatus for applying solder to exposed metallic surfaces on one face of circuit boards or the like comprising means for conveying circuit boards along an upward sloping path, a reservoir adapted to contain molten solder, a first nozzle communicating with the reservoir and having a solder outlet positioned above the reservoir and having a circuit board entry side and a circuit board exit side, the first nozzle being formed to produce a jet-like solder wave which is upwardly projecting with an initial high pressure gradient for engagement with the lower faces of the circuit board as they pass along the path above the nozzle exit, a second nozzle communicating with the reservoir and having a solder outlet positioned above the reservoir and having a circuit board entry side and a circuit board exit side, the second nozzle being spaced from and positioned downstream of the first nozzle with respect to the direction of conveying of the circuit boards and being formed to produce a smooth laminar solder wave for engagement with the lower faces of the circuit boards as they pass along the path, and means for circulating solder through the nozzles.

16. Apparatus according to claim 15 wherein the solder outlet of the first nozzle is formed to direct the wave upwardly and to have a portion thereof flow forwardly with respect to the direction of circuit board movement whereby a major portion of the solder discharge from the first nozzle flows across the exit side of the first nozzle.

17. Apparatus according to claim 16 wherein the solder outlet of the first nozzle is formed to direct the wave upwardly and to have a portion thereof flow rearwardly with respect to the direction of circuit board movement whereby solder discharged form the first nozzle flows across the entrance side of the first nozzle.

18. Apparatus according to claim 15 wherein the second nozzle forms the laminar wave such that a portion of the wave flows downwardly at the entrance side of the said second nozzle.

19. Apparatus according to claim 18 wherein the remainder of the laminar solder wave exiting from the second nozzle exits less steeply form the second nozzle exit side than from the entry side.

20. Apparatus according to claim 15 wherein solder wave produced by said first nozzle is a turbulent jet.

21. Apparatus according to claim 15 where said smooth laminar wave is at the entry side of said second nozzle.

22. A method of applying solder to one face of each of a plurality of circuit boards or the like having exposed metallic surfaces on the one face comprising passing the circuit boards at a predetermined speed along an upwardly sloping path, with the one face directly downwardly, forming an upwardly projecting jet-like solder wave with an initial high pressure gradient beneath the path such that the one face of the circuit boards enter and exit from the wave whereby some solder is forced onto the metallic surfaces, forming a smooth laminar solder wave downstream of the jet-like wave with respect to the direction of travel of the circuit boards such that the one face of the circuit boards subsequently enter and exit from the smooth solder wave whereby soldering of the metallic surfaces is completed.

23. A method according to claim 22 wherein a greater volumetric portion of the smooth solder wave is permitted to flow downwards on the entry side of the wave.

24. A method according to claim 23 wherein the remaining portion of the smooth solder wave is permitted to flow downwards on the exit side of the wave and is guided in a smooth horizontal or downward sloping stream in substantially the same direction as the circuit boards.

25. A method according claim 22 wherein a portion of the jet-like solder wave is directed in a direction opposite the direction of entry of the circuit board.

26. A method as in claim 22 wherein the upwardly projecting jet-like solder wave is turbulent.

27. A method of applying solder to one faces of printed circuit boards carrying on their one faces leadless chip components having closely spaced contact pads comprising passing the circuit boards at a predetermined speed along an upwardly sloping path with the one faces directed downwardly, forming an upwardly projecting jet-like solder wave with an initial high pressure gradient beneath the path such that the one faces of the circuit boards enter and exit from the wave whereby some solder is formed onto the metallic surfaces, forming a smooth laminar solder wave downstream of the jet-like wave with respect to the direction of travel of the circuit boards such that the one faces of the circuit boards subsequently enter and exit from the smooth solder wave whereby soldering of the metallic surface is completed.

28. A method according to claim 27 wherein a greater volumetric portion of the smooth wave is permitted to flow downwards on the entry side of this wave.

29. A method according to claim 28 wherein the remaining portion of the smooth solder wave is permitted to flow downwards on the exit side of the wave and is guided in a smooth horizontal or downward sloping stream in substantially the same direction as the circuit boards.

* * * * *